United States Patent
Hegel et al.

(10) Patent No.: US 6,864,019 B2
(45) Date of Patent: Mar. 8, 2005

(54) RECORDING MATERIAL FORMULATIONS FOR HOLOGRAPHIC MEDIA

(75) Inventors: Ramon F. Hegel, North St. Paul, MN (US); Stanley C. Busman, North St. Paul, MN (US)

(73) Assignee: Imation Corp., Oakdale, MN (US)

( * ) Notice: Subject to any disclaimer, the term of this patent is extended or adjusted under 35 U.S.C. 154(b) by 173 days.

(21) Appl. No.: 10/186,378

(22) Filed: Jun. 27, 2002

(65) Prior Publication Data

US 2004/0002008 A1 Jan. 1, 2004

(51) Int. Cl.[7] .................................................. G03H 1/02
(52) U.S. Cl. ........................... 430/1; 430/2; 430/281.1; 359/3
(58) Field of Search ........................... 430/1, 2, 281.1; 359/3

(56) References Cited

U.S. PATENT DOCUMENTS

| | | | |
|---|---|---|---|
| 3,912,516 A | | 10/1975 | Recchia et al. |
| 4,720,529 A | | 1/1988 | Kimura et al. |
| 4,942,102 A | * | 7/1990 | Keys et al. ..................... 430/1 |
| 5,776,996 A | * | 7/1998 | Okamoto et al. ............. 522/26 |
| 5,907,023 A | | 5/1999 | Chawla |
| 6,103,454 A | | 8/2000 | Dhar et al. |
| 6,620,946 B2 | * | 9/2003 | Dershem et al. ............ 548/545 |
| 2003/0083395 A1 | * | 5/2003 | Trentler et al. ................ 522/38 |
| 2003/0087104 A1 | * | 5/2003 | Dhar et al. .............. 428/422.8 |
| 2003/0224250 A1 | * | 12/2003 | Setthachayanon et al. ..... 430/1 |

FOREIGN PATENT DOCUMENTS

| | | |
|---|---|---|
| EP | 1 033 623 A2 | 9/2000 |
| JP | 60251152 | 12/1985 |

OTHER PUBLICATIONS

Schilling et al., "Acrylate Oligomer–Based Photopolymers for Optical Storage Applications," *Chemistry of Materials*, vol. 11, No. 2, pp. 247–254, 1999.

\* cited by examiner

*Primary Examiner*—Martin Angebranndt
(74) *Attorney, Agent, or Firm*—Eric D. Levinson

(57) ABSTRACT

Holographic data storage media having a sandwiched construction are described in which a holographic recording material is sandwiched between two substrates. A variety of different formulations of the holographic recording material are also described. By improving the formulation of the photosensitive material, holographic media can be improved.

16 Claims, 2 Drawing Sheets

RECORDING MATERIAL FORMULATIONS FOR HOLOGRAPHIC MEDIA

FIELD

The invention relates to holographic data storage media, and more particularly to recording material formulations for use in holographic data storage media.

BACKGROUND

Many different types of data storage media have been developed to store information. Traditional media, for instance, include magnetic media, optical media, and mechanical media to name a few. Increasing data storage density is a paramount goal in the development of new or improved types of data storage media.

In traditional media, individual bits of information are stored as distinct mechanical, optical, or magnetic changes on the surface of the media. For this reason, data storage medium surface area imposes physical limits on data densities for a given recording technique.

Holographic data storage media can offer higher storage densities than traditional media. In a holographic medium, data can be stored throughout the volume of the medium rather than the medium surface. In other words, holographic media permit three-dimensional data storage. Theoretical holographic storage densities can approach tens of terabits per cubic centimeter.

In holographic data storage media, entire pages of information, e.g., bitmaps, can be stored as optical interference patterns within a photosensitive recording material. This can be done by intersecting two coherent laser beams within the recording material. The first laser beam, called the object beam, contains the information to be stored; and the second, called the reference beam, interferes with the object beam to create an interference pattern that can be stored in the recording material as a hologram. When the stored hologram is later illuminated with only the reference beam, some of the light of the reference beam is diffracted by the holographic interference pattern. Moreover, the diffracted light creates a reconstruction of the original object beam. Thus, by illuminating a recorded hologram with the reference beam, the data encoded in the object beam can be recreated and detected by a data detector such as a camera.

Holographic data storage media typically have a sandwiched construction in which a photosensitive recording material is sandwiched between two substrates. The holograms are recorded and stored in the photosensitive material. By improving the formulation of the photosensitive material, holographic media can be improved. In particular, improved formulations are desirable to increase storage densities of holographic media, and/or to improve environmental stability.

SUMMARY

The invention is directed to holographic data storage media, and recording material formulations for use in holographic data storage media. A variety of different formulations of the photosensitive holographic recording material are outlined below. By improving the formulation of the photosensitive recording material in which holographic bit maps are stored, holographic media can be improved.

For example, the recording material for a holographic medium may include a matrix polymer resulting from the mixture of two or more oligomeric components, a photoinitiator mixed in a first oligomeric component prior to mixing the oligomeric components, and a write monomer mixed in a second oligomeric component prior to mixing the oligomeric components. For example, the photoiniator and write monomer may be dissolved in the respective oligomeric components prior to mixing. One or more additives such as photoinitiator additives, oxidants, or catalysts may also be dissolved in one of the oligomeric components prior to mixing. A number of different choices for the various components and additives of the formulation are discussed in greater detail below. By selecting the components and additives of the formulation, improved holographic media can be realized.

The invention may provide one or more advantages. For example, by improving the formulation of the recording material used in holographic media, the holographic media can be likewise improved. In particular, improved formulations may increase the storage density and performance of holographic media, and/or improve environmental stability of the media.

Additional details of these and other embodiments are set forth in the accompanying drawings and the description below. Other features, objects and advantages will become apparent from the description and drawings, and from the claims.

DETAILED DESCRIPTION

In general, the invention is directed to a holographic data storage medium having a sandwiched construction in which a holographic recording material is sandwiched between two substrates. A variety of different formulations of the holographic recording material are outlined below. By improving the formulation of the photosensitive material, holographic media can be improved. In particular, improved formulations are desirable to increase the storage density and performance of holographic media, and/or to improve environmental stability. In addition, useful substrate materials are discussed, which can also improve holographic media.

Figure 1:
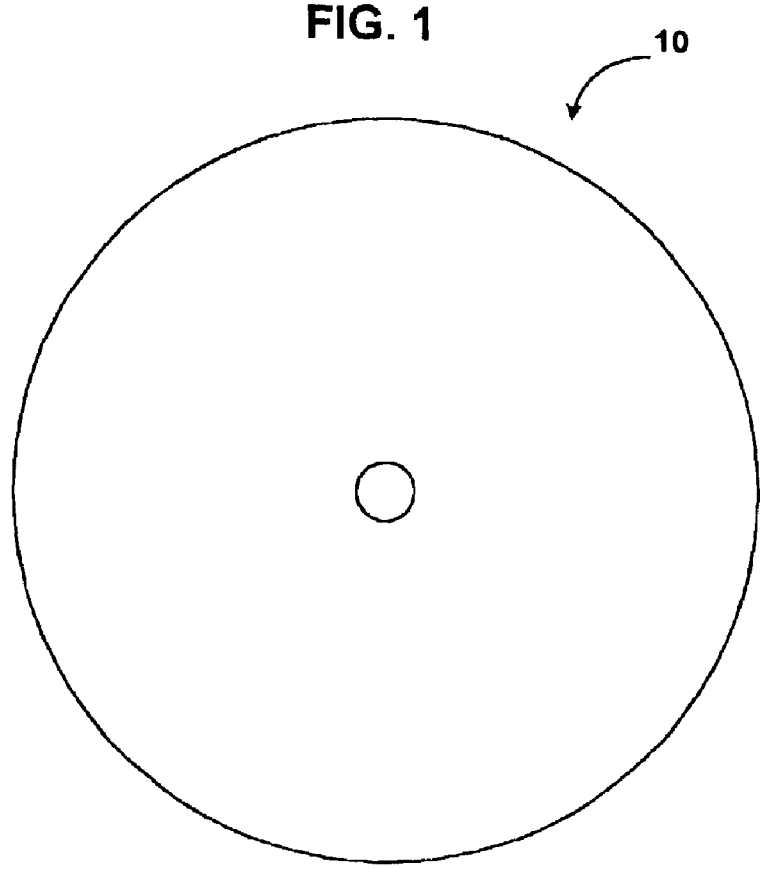
FIG. 1 is a top view of an exemplary holographic data storage medium according to an embodiment of the invention.
Figure 2:
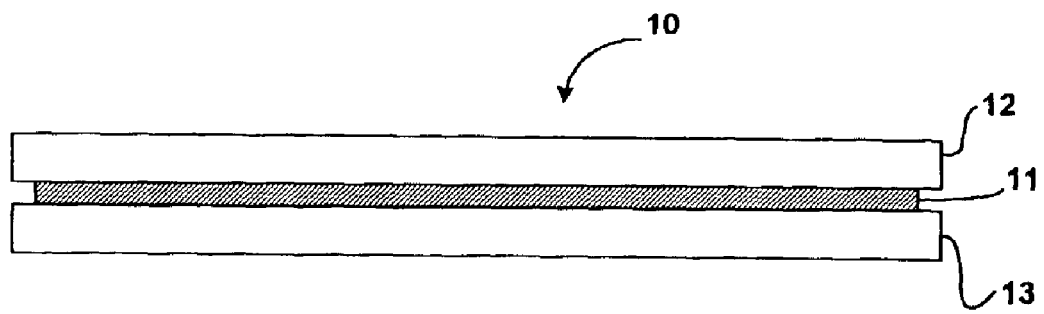
FIG. 2 is a cross-sectional side view of an exemplary holographic data storage medium according to an embodiment of the invention.

FIG. 1 is a top view of an exemplary holographic data storage medium 10. As illustrated in FIG. 1, the holographic data storage medium 10 may take the form of a rotatable disk. Alternatively, holographic data storage medium 10 may take the form of a rectangular card, or any other shape. FIG. 2 is a cross-sectional side view of holographic data storage medium 10. As shown in FIG. 2, holographic data storage medium 10 has a sandwich construction in which a photosensitive holographic recording material 11 is sandwiched between two substrates 12, 13. As outlined in greater detail below, holographic recording material 11 can be formulated to exhibit certain advantageous qualities in order to improve holographic data storage medium 10.

By way of example, substrates 12, 13 may comprise an optically transparent material such as an optically transparent thermoplastic material. Example materials useful in forming substrates 12, 13 include: polycarbonate, polymethylmethacrylate (PMMA), amorphous polyolefin, and glass. The outer surfaces of one or both of substrates 12, 13 may be coated with an anti-reflective coating.

Polycarbonate, polymethylmethacrylate (PMMA), amorphous polyolefin are particularly attractive candidate materials for substrates 12 and 13 because these thermoplastic materials can be injection molded at relatively low cost. For injection molded substrates, several factors may determine which substrate material is best suited for media fabrication. For instance, the substrate material should be capable of confining a viscous formulation during the fabrication process. In addition, the substrate material should be capable of exhibiting surface variations, e.g., embossed or molded surface variations, that can carry precision tracking and/or pre-format information. The substrate material should also be capable of encapsulating the holographic recording material to protect the holographic recording material from environmental contamination. In addition, the substrate material should have relatively low birefringence. Birefringence is generally a measure of the variation of the index of refraction with orientation in the material. Large variations in the index of refraction with orientation, for instance, are generally undesirable for holographic media substrate materials.

Additionally, a substrate material should be chosen so that surface reflection and intrinsic optical scattering are minimized as much as possible. Moreover, the medium may need an anti-reflection coating, and thus, it is desirable to use a substrate material to which an anti-reflective coating can be applied. In addition, as indicated above, material cost may be a factor. Considering all these factors, the thermoplastic material referred to as amorphous polyolefin (APO) appears to be well suited as a substrate material for use in holographic media. In addition to meeting the design criteria above, APO absorbs very little water vapor. Therefore, if APO is used as a holographic medium substrate, an anti-reflective coating can be applied to the medium without the need to bake or de-gas the substrate.

The desired thickness range of substrates 12 and 13 may fall between approximately 0.5 millimeters and 1.3 millimeters. Birefringence may be too high if the substrate thickness is less than approximately 0.5 millimeters, and thickness variations caused by differential cooling of the thermoplastic material during the injection molding process may become a problem if substrate thickness is greater than approximately 1.3 millimeters. Therefore, approximately 0.5 millimeters to 1.3 millimeters may represent the desired range for thermoplastic substrates used in sandwich construction holographic data storage media, and APO may be the most suitable thermoplastic material for such substrates. The substrates 12 and 13 may be formed to have any of a wide variety of shapes or molded features. For example, containment features may be added to the outer edges of substrates 12 and 13 to improve encapsulation of holographic recording material 11 between substrates 12 and 13.

Holographic recording material 11 may comprise a matrix polymer resulting from the mixture of two or more oligomeric components. A photoinitiator can be mixed in a first oligomeric component, and a write monomer can be mixed in a second oligomeric component. An additive may also be dissolved in one of the oligomeric components. For example, an oxidant and possibly a catalyst may also be mixed in one of the oligomeric components. Typically the oxidant and the catalyst (if desired) are dissolved in the second oligomeric component that has the monomer dissolved therein. As outlined in greater detail below, one or more of the oligomeric components, the photoinitiator, various additives such as oxidants or catalysts, or the write monomer can be selected to promote improved holographic media performance. The various percentages of the various components can also be selected in order to promote improved holographic media performance.

After mixing the desired additives in the oligomeric components, such as by dissolving the additives in the oligomeric components, the oligomeric components can be mixed to create a matrix polymer. The matrix polymer resulting from the mixture of the two or more oligomeric components can then be injected between two substrates and cured. In this manner, holographic media can be created.

The first oligomeric component may comprise monomeric or oligomeric poly isocyanate. Example isocyanates include, 1,6-hexamethylene diisocyanate, toluene diisocyanate, diphenylmethane 4,4'-diisocyanate, and aliphatic polyisocyanates such as Desmodur N-100, N-3200, N3300, N3390 or N3400.

The photoinitiator can be dissolved in the first oligomeric component, e.g., the isocyanate. Example photoinitiators include Irgacure 784, Irgacure 727, Irgacure 819, and Irgacure 1700 photoinitiators. Photoinitiator selection may be based on absorption characteristics and the desired wavelength of light that is used for recording. A typical range for the % by weight of the photoinitiators may be between 0.1 to 2%, although the invention is not necessarily limited in that respect.

In addition, one or more photoinitiator additives such as oxidants, coinitiators or sensitizers may be dissolved in one or both of the oligomeric components. Possible additives may include t-butyl hydroperoxide, tris-trichloromethyl-s-triazine, diphenyl iodonium hexafluorophosphate, t-butyl peroxybenzoate Luperox P or tBPB, di-t-butyl peroxide Luperox D1, cumene hydroperoxide Luperox CU90, dimethyl t-butyl peroxide, t-amyl perbenzoate Luperox TAP, t-butyl peroxy acetate Luperox 7M75, t-butyl peroxy ethylhexyl carbonate Luperox TBEC, and t-amyl peroxy ethylhexyl carbonate Luperox TAEC. The abbreviation t- refers to tertiary. Peroxyesters may work better than hydroperoxides and alkyl peroxides. The Luperox organic peroxides are made by Atofina Chemicals of Philadelphia, Pa. These and other additives may be purchased from Aldrich Chemical Company of Milwaukee, Wis., USA.

Media performance may be improved for various scenarios by selecting the appropriate photoinitiator and the appropriate percentage by weight of the photoinitiator in the resultant formulation. Additional details of advantageous qualities resulting from the selection of particular photoinitiators are provided in the examples below.

The second oligomeric component may comprise a polyol such as polyether, polyester, polycarbonate, polybutadiene or another suitable polyol. Media performance may be improved for various scenarios by selecting the appropriate polyol. For example, polyether generally provides good environmental stability, and polyester may provide good oxidative stability under exposure to light. However, polyester may hydrolyze upon exposure to high levels of humidity over long periods of time.

Polybutadiene polyol may be a particularly useful choice for the second oligomeric component. Polybutadiene polyol has proven to be very environmentally stable, and has proven to exhibit good oxidative stability. In addition, polybutadiene polyol is very moisture resistant, and is therefore unlikely to hydrolyze upon exposure to moisture. In particular, polybutadiene polyol is much more hydrolytically stable in comparison to polyether and polyester based urethanes at environmental conditions of 100 degrees Celsius and 95 percent relative humidity.

A portion of the polyol, e.g., 10 percent, may comprise a low molecular weight glycerol propoxylate (GPX) trifunctional crosslinker. GPX may improve the dynamic range of the resultant media and may improve the volume ratio of the first and second oligomeric components so that an in-line static mixing process is more effective for media fabrication.

The write monomer can be dissolved in the second oligormeric component, e.g., the polyol. The write monomer may comprise any of a wide variety of high index of refraction monomers including, for example, tribromo phenyl acrylate (TBPA), tetrabromo cresol acrylate (TTBCA), pentabromo phenyl acrylate (PBPA), quinoline acrylate (QNA), quinaldine acrylate (QDA), phenoxybenzyl acrylate (PBNA), N-vinyl carbazole, vinyl benzoate, N-vinyl imidazole, or a write monomer from a carbazole class of nitrogen heterocycles. Additional details of advantageous qualities resulting from the selection of particular write monomers are provided in the examples below.

As mentioned, the oxidant or another additive can also be dissolved in one of the oligomeric components. Typically, the oxidant is dissolved in the second oligomeric component, e.g., the polyol, although the invention is not limited in that respect. For example, the oxidant may comprise a co-initiator that improves the performance of the resultant media, and may effect the color of the formulation. Oxidants that may be used include t-butyl hydroperoxide (tBHP), t-butyl peroxybenzoate (tBPB, Luperox P). t-Butyl peroxybenzoate may be particularly useful as an oxidant of a holographic media formulation as can be appreciated by the examples below.

EXAMPLES

A number of different holographic media were created using various different formulations for the recording material. The media was then tested in order to assess various qualities indicative of effective holographic media. One quality that was measured is referred to as the M number. The M number refers to the dynamic range parameter:

$$M \text{ number} = \Sigma(\eta_i)^{1/2} \approx k(\Delta n) \text{ (Thickness)}$$

Where $k=(\pi/(2\lambda \cos \theta))$ and $\eta_i$ represents the efficiency of each recorded hologram, $\lambda$ is the wavelength and $\theta$ is the Bragg angle.

Another quality that was measured was the percentage of shrinkage of the formulation. In general, it may be desirable to limit formulation shrinkage in order to maximize data storage capacity. For example, it may be desirable to limit formulation shrinkage to less than approximately 0.1 percent.

Another quality that was measured was the sensitivity of the resultant media. The sensitivity can quantify the amount of energy per unit area required to record holograms. Sensitivity is typically quantified in units of area per unit energy, e.g., $cm^2$/Joule. Increasing the sensitivity can improve media performance.

Additional qualities that were observed or measured for various media included the color of the recording material formulations and the initial record times associated with the media. The initial record time refers to the time it takes to record a single hologram in the medium after an initial inhibition time has passed. The melting point was also measured for various monomers. The melting point refers to a physical characteristic of the write monomer. Lower melting points are desirable to improve monomer solubility and to increase its rate of diffusion in the matrix polymer formulation.

The following formulations were used for the write monomers and oxidants described in Tables 1 and 2. Components are listed as parts by weight (pbw).

| Part A | Isocyanate-N3400 | 31.1–31.6 pbw |
|---|---|---|
| | Photoinitiator-Irgacure 784 | 0.8 pbw |
| Part B | Polyol-Glycerol propoxylate | 62.2–63.2 pbw |
| | Write monomer | 3.7–5.1 pbw |
| | Catalyst-Dibutyltin diacetate | 0.5 pbw |
| | Oxidant | 0.2 pbw |

In general, the media was created by sandwiching the recording material formulations between two APO substrates. The APO substrates had thicknesses of approximately 1.2 millimeters, and the sandwiched recording material formulation defined a thickness of approximately 500 microns.

During media fabrication, Part A and Part B of the formulations were mixed in an in-line static mixing process in order to ensure that the material did not cure until after it was injected between the substrates. The formulation was injected by center dispensing the formulation through an inner diameter of the substrates. During injection of the formulation, the substrates were forced against upper and lower reference planes in order to ensure substantial parallelism of the substrates relative to one another. The formulation was then allowed to cure in situ.

The tables below summarize qualities that were observed or measured for various formulations. For each table, the non-listed components of the formulation were generally held constant. Thus, the tables can be used to attribute the measured results with the use of the listed component or components. In other words, the listed components represent the variable being tested, and thus, differences between measured quantities may be attributed to differences between the listed components.

TABLE 1

| Write Monomer | Oxidant 0.2% | M#/ 200 microns at 23 C. | M#/ 200 microns at 55 C. | % shrinkage |
|---|---|---|---|---|
| Tribromo phenyl acrylate (TBPA) 3.6% | tBHP | 2.6 | 1 | 0.11 |
| TBPA 4.0% | — | 2.8 | — | — |
| TBPA 5.1% | — | 4.1 | — | 0.31 |
| Tetrabromo cresol acrylate (TTBCA) 3.6% | — | 3.1 | — | 0.06 |
| TTBCA 5.0%, | tBPB | 3.6 | 3.7 | 0.09 |
| TTBCA 5.3%, | tBPB | 3.3 | 3.95 | 0.12 |

Table 1 lists various different write monomers that were used in a formulation. The write monomers comprised the listed percentage by weight of the formulations. Oxidants were also added when listed in the table. The monomers and oxidants (when listed) were dissolved in the polyol, and then mixed with the isocyanate in an in-line static mixing process before being center injected and cured between two substrates.

As can be appreciated by Table 1, the use of the monomer TTBCA proved to yield a relatively high M number and acceptable shrinkage. The oxidant tBPB may have further improved the M number. When TTBCA was used with tBPB, the M number was not substantially affected after heat aging for at least two weeks at high temperatures, i.e., 55C. In fact, the M number unexpectedly increased at the high temperatures when TTBCA was used with tBPB.

In another example, quinoline acrylate (QNA) was synthesized and used as the write monomer of a formulation similar to the formulations described with reference to Table 1. QNA has the chemical structure:

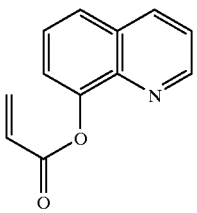

QNA was synthesized by dissolving 8 hydroxy quinoline in toluene and triethyl amine, followed by slow addition of acryloyl chloride while cooling in an ice bath to keep the reaction temperature below 70C. The precipitated triethyl amine hydrochloride salt was filtered off and the toluene solution was washed with water, dried with a saturated solution of sodium chloride, and most of the toluene was stripped off under vacuum. The remaining product (an oil with a small amount of toluene) was cooled to crystallize the quinoline acrylate which was then filtered and rinsed with hexane to a nearly colorless solid with a melting point of approximately 50–52C.

Media created to include 5% by weight QNA in the formulation exhibited a M#/200µ of approximately 3.8, a sensitivity ($cm^2/J$) of approximately 50–60 and a percentage of shrinkage between approximately 0.1 and 0.24.

In another example, quinaldine acrylate (QDA) was synthesized in a manner similar to quinoline acrylate and used as the write monomer of a formulation similar to the formulations described with reference to Table 1. QDA has the chemical structure:

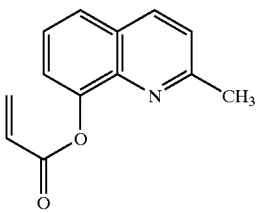

Tetrabromo creosol, hydroxy quinaldine and hydroxyquinoline were converted to acrylates using acryloyl chloride and a trialkyl amine. Media created to include 5% by weight QDA in the formulation exhibited an M#/200µ of approximately 4.0, a sensitivity ($cm^2/J$) of approximately 120–138, and a percentage of shrinkage of approximately 0.29.

Media created to include 4% by weight QDA in the formulation exhibited a M#/200µ of approximately 3.6, a sensitivity ($cm^2/J$) of approximately 85, a percentage of shrinkage of approximately 0.23, and an initial record time of approximately 0.15 seconds.

Media created to include 3% by weight QDA in the formulation exhibited a M#/200µ of approximately 2.5, a sensitivity ($cm^2/J$) of approximately 58, and a percentage of shrinkage of approximately 0.2.

In another example, phenoxybenzyl acrylate (PBNA) was synthesized and used as a write monomer of a formulation similar to the formulations described with reference to Table 1. PBNA has the chemical structure:

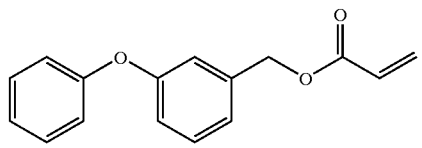

PBNA was synthesized in a manner similar to quinoline acrylate to give a product that did not crystallize at 23C.

Media created to include 5% by weight PBNA in the formulation exhibited an M#/200µ of approximately 3.0, exhibited a sensitivity ($cm^2/J$) of approximately 31, and exhibited a percentage of shrinkage of approximately 0.18.

One way to increase the refractive index of PBNA may be to add bromine to the phenoxy ring starting with tribromo phenol and 2,3 or 4-chlorobenzyl alcohol, and then convert to the acrylate to get tribromo phenoxy benzyl acrylate.

TABLE 2

| Write Monomer | M #/ 200 µ | Record Time seconds | Sensitivity $cm^2/J$ | % Shrinkage | MP ° C. |
| --- | --- | --- | --- | --- | --- |
| TBPA 3.7% | 2.3 | 0.8 | 10 | 0.1 | 77–78 |
| TTBCA 5% | 3.8 | 1.0 | 15 | 0.13–0.18 | 122–123 |
| QDA 5% | 4.0 | 0.2 | 120 | 0.3 | 48–49 |
| QDA 4.0% | 3.6 | 0.3 | 90 | 0.23 | — |
| QDA 3.7% | 2.5 | — | 58 | 0.20 | — |
| QNA 5% | 3.8 | 0.4 | 60 | 0.08–0.14 | 52–53 |
| PBNA 5% | 3 | 0.2 | 31 | 0.18 | <room temperature |

Table 2 lists various different write monomers that were used in a formulation. The write monomers comprised the listed percentage by weight of the formulations. The monomers of Table 2 were dissolved in the polyol, and then mixed with the isocyanate in a static mixing process before being center injected and cured between two substrates.

As can be appreciated by Table 2, different monomers may be selected to yield a relatively high M number, high sensitivity, reduced record times, and acceptable shrinkage. For example, QDA may yield a very high sensitivity, with percent shrinkage that approaches the 0.1% target. Reducing the percent by weight of QDA to less than 3.0% may be necessary in order to achieve less than 0.1% shrinkage. This may be due to the lower molecular weight of the monomer relative to brominated acrylate monomers.

Figure 3:
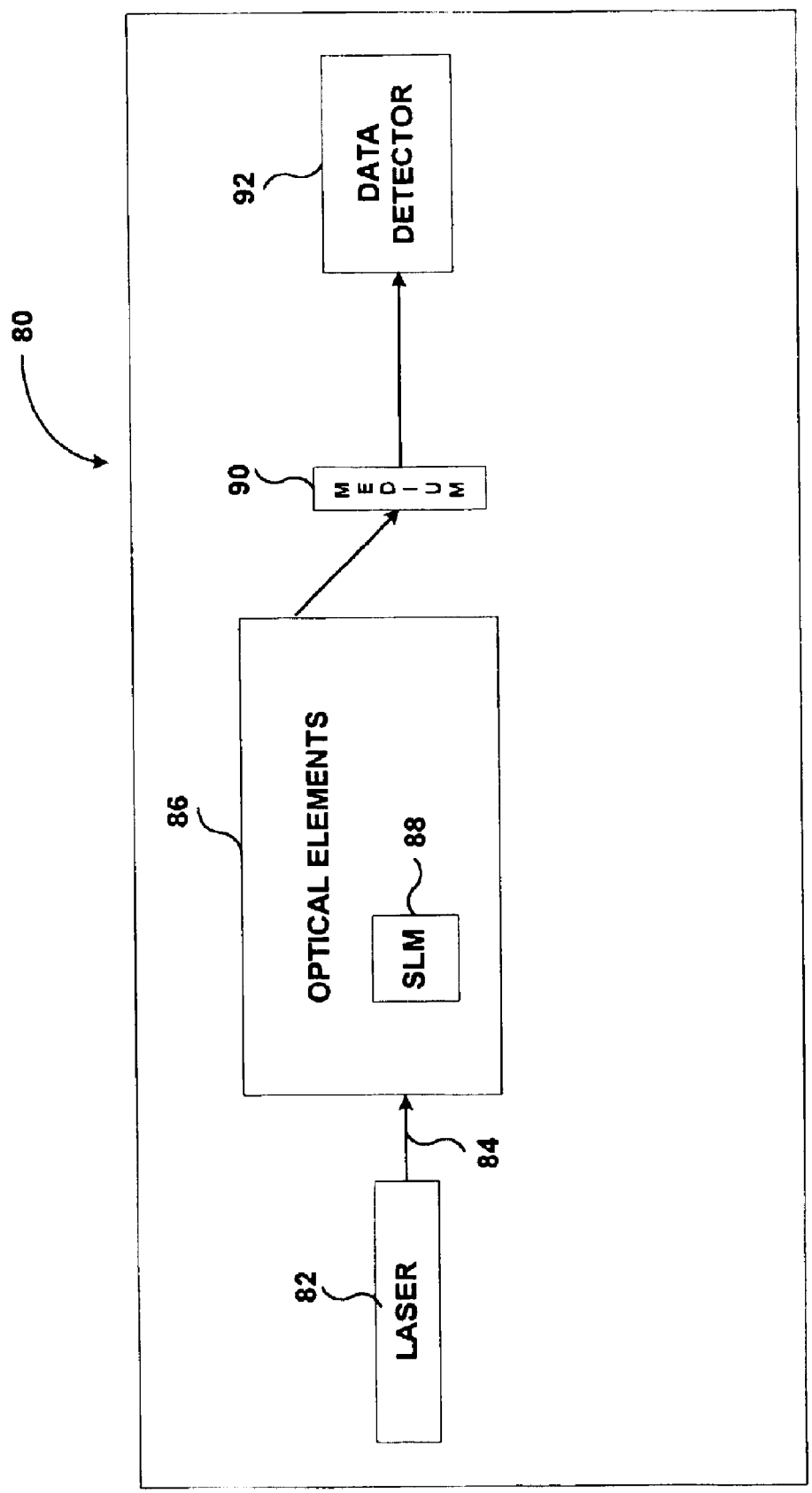
FIG. 3 is a block diagram of a holographic data storage system for reading and possibly writing to a holographic recording medium

FIG. 3 is a block diagram of a holographic data storage system 80 for reading and possibly writing to a holographic recording medium 10. System 80 includes at least one laser 82 that produces laser light 84. Laser light 84 passes through optical elements 86. For instance, optical elements 86 may include one or more beam splitters, lenses and mirrors. A data encoder, such as spatial light modulator (SLM) 88 may be positioned within the optical elements to encode data in the laser light 84. Medium 10 is positioned where it can be written with holographic bit maps. Medium 10, for instance, may include one or more of the features described above, including a recording material formulated by selecting various components that yield advantageous results. Data detector 92, such as a camera, is positioned to detect data encoded bit maps on medium 10.

In the system, at least one laser 82 may be carried on a record/read head (not shown). Additional lasers (not shown) may also be carried on the record/read head. In this manner, laser 82 may be properly positioned to read and write holograms on the medium 10. In particular, the recording material can be formulated by selecting various components addressed above in order to improve medium 10 for use in system 80.

The invention may be capable of providing advantages in holographic media. In general, by improving the formulation of the recording material used in holographic media, the holographic media can be likewise improved. In particular, improved formulations may increase the storage density and performance of holographic media such as by increasing the M number and sensitivity of the media. Shrinkage of the formulation during cure can also be reduced. A limited amount of shrinkage may be required by media specification. In addition, other quantities such as the melting point of the write monomer or the color of the formulation can be selected as outlined above. The environmental stability of the media can also be improved.

Various embodiments of the invention have been described. For example, a variety of different formulations of the holographic recording material have been described for use in a holographic data storage medium. Nevertheless, various modifications may be made without departing from the scope of the following claims. For example, two or more of write monomers outlined above may be mixed in a second oligomeric component prior to mixing the oligomeric components. In addition, two or more write monomers outlined above may be mixed in various different oligomeric components prior to mixing the different oligomeric components. In these cases, advantageous qualities associated with each of the different write monomers may be realized in a holographic medium. These and other embodiments are within the scope of the following claims.

What is claimed is:

1. A recording material for a holographic medium comprising:
    a matrix polymer resulting from the mixture of two or more oligomeric components, wherein at least one of the oligomeric components includes a polyol selected from the group consisting of a polyester polyol, polyether polyol, polycarbonate polyol, and polybutadiene polyol;
    a photoinitiator mixed in a first oligomeric component prior to mixing the oligomeric components; and
    a write monomer mixed in a second oligomeric component prior to mixing the oligomeric components, wherein the write monomer is selected from the group consisting of quinoline acrylate (ONA) and quinaldine acrylate (ODA).

2. The recording material of claim 1, wherein the write monomer comprises quinaldine acrylate (QDA).

3. The recording material of claim 1, further comprising one or more photoinitiator additives dissolved in at least one of the oligomeric components prior to mixing the oligomeric components, wherein the photoinitiator additives are selected from the group consisting of: t-butyl hydroperoxide, tris-trichloromethyl-s-triazine, diphenyl iodonium hexafluorophosphate, t-butyl peroxybenzoate (tBPB), di-t-butyl peroxide, cumene hydroperoxide, dimethyl t-butyl peroxide, t-amyl perbenzoate, t-butyl peroxy acetate, t-butyl peroxy ethylhexyl carbonate (TBEC), and t-amyl peroxy ethylhexyl carbonate (TAEC).

4. The recording material of claim 3, wherein the photoinitiator is selected from the group consisting of: bis(,eta 5-2,4-cyclopentadien-1-yl)-bis(2,6-difluoro-3-(1H-pyrrol-1-yl)-phenyl) titanium, bis(2,6-difluorophenyl)bis[(1,2,3,4,5-eta)-1-methyl-2,4-cyclopentadien-1-yl]-titanium, phenyl bis(2,4,6-trimethyl benzoyl) phosphine oxide, and a mixture of 25% Bis(2,6-dimethoxybenzoyl)-2,4,4-trimethylpentylphosphine oxide and 75% 2-hydroxy-2-methyl-1-phenyl-1-propanone.

5. The recording material of claim 1, wherein the photoinitiator comprises bis(,eta 5-2,4-cyclopentadien-1-yl)-bis(2,6-difluoro-3-(1H-pyrrol-1-yl)-phenyl) titanium.

6. The recording material of claim 1, further comprising an oxidant mixed in at least one of the oligomeric components prior to mixing the oligomeric components.

7. The recording material of claim 6, further comprising a catalyst mixed in the second oligomeric component prior to mixing the oligomeric components.

8. The recording material of claim 6, wherein the oxidant comprises t-butyl peroxybenzoate.

9. A recording material for a holographic medium comprising:
    a matrix polymer resulting from the mixture of two or more oligomeric components;
    a photoinitiator mixed in a first oligomeric component prior to mixing the oligomeric components; and
    a write monomer mixed in a second oligomeric component prior to mixing the oligomeric components, wherein the write monomer includes a monomer selected from the group consisting of: [tribromo phenyl acrylate (TBPA), tetrabromo cresol acrylate (TTBCA), pentabromo phenyl acrylate (PBPA)], quinoline acrylate (QNA), and quinaldine acrylate (QDA).

10. The recording material of claim 9, wherein the write monomer comprises quinaldine acrylate (QDA).

11. A recording material for a holographic medium comprising:
    a matrix polymer resulting from the mixture of two or more oligomeric components;
    a photoinitiator mixed in a first oligomeric component prior to mixing the oligomeric components; and
    a write monomer selected from the group consisting of quinoline acrylate (ONA) and quinaldine acrylate (QDA), mixed in a second oligomeric component prior to mixing the oligomeric components; and
    a photoinitiator additive mixed in at least one of the oligomeric components prior to mixing the oligomeric components, wherein the photoinitiator additive is selected from the group consisting of: t-butyl hydroperoxide, tris-trichloromethyl-s-triazine, diphenyl iodonium hexafluorophosphate, t-butyl peroxybenzoate (tBPB), di-t-butyl peroxide,cumene hydroperoxide, dimethyl t-butyl peroxide, t-amyl perbenzoate, t-butyl peroxy acetate, t-butyl peroxy ethylhexyl carbonate (TBEC), and t-amyl peroxy ethylhexyl carbonate (TAEC).

12. The recording material of claim 11, wherein the photoinitiator is selected from the group consisting of: bis(.eta 5-2,4-cyclopentadien-1-yl)-bis(2,6-difluoro-3-(1H-pyrrol-1-yl)-phenyl) titanium, bis(2,6-difluorophenyl)bis[(1,2,3,4,5-eta)-1-methyl-2,4-cyclopentadien-1-yl]-titanium, phenyl bis(2,4,6-trimethyl benzoyl) phosphine oxide, and a mixture of 25% Bis(2,6-dimethoxybenzoyl)-2,4,4-trimethylpentylphosphine oxide and 75% 2-hydroxy-2-methyl-1-phenyl-1-propanone.

13. The recording material of claim 11, wherein the photoinitiator comprises bis(.eta 5-2,4-cyclopentadien-1-yl)-bis(2,6-difluoro-3-(1H-pyrrol-1-yl)-phenyl) titanium.

14. A holographic data storage medium comprising:
    a first substrate;
    a second substrate; and
    a holographic recording material between the first and second substrates comprising:
        a matrix polymer resulting from the mixture of two or more oligomeric components, wherein at least one of the oligomeric components includes a polyol selected from the group consisting of a polyester polyol polyether, polyol, polycarbonate polyol, and polybutadiene polyol;

a photoinitiator mixed in a first oligomeric component prior to mixing the oligomeric components, and a write monomer selected from the group consisting of quinoline acrylate (ONA) and quinaldine acrylate (ODA), mixed in a second oligomeric component prior to mixing the oligomeric components.

15. The holographic data storage medium of claim 14, the holographic recording material further comprising a photoinitiator additive mixed in at least one of the oligomeric components prior to mixing the oligomeric components, wherein the photoinitiator additive is selected from the group consisting of: t-butyl hydroperoxide, tris-trichloromethyl-s-triazine, diphenyl iodonium hexafluorophosphate, t-butyl peroxybenzoate (tBPB), di-t-butyl peroxide, cumene hydroperoxide, dimethyl t-butyl peroxide, t-amyl perbenzoate, t-butyl peroxy acetate, t-butyl peroxy ethylhexyl carbonate (TBEC), and t-amyl peroxy ethylhexyl carbonate (TAEC).

16. The holographic data storage medium of claim 14, the holographic recording material further comprising an oxidant mixed in at least one of the oligomeric components prior to mixing the oligomeric components, wherein the oxidant comprises t-butyl peroxybenzoate.

\* \* \* \* \*

UNITED STATES PATENT AND TRADEMARK OFFICE
CERTIFICATE OF CORRECTION

PATENT NO.    : 6,864,019 B2
DATED         : March 8, 2005
INVENTOR(S)   : Hegel et al.

It is certified that error appears in the above-identified patent and that said Letters Patent is hereby corrected as shown below:

Column 10,
Lines 18-20, "[tribromo phenyl acrylate (TBPA), tetrabromo cresol acrylate (TTBCA), pentabromo phenyl acrylate (PBPA)]," should be deleted.
Line 31, "(ONA)" should read -- (QNA) --.
Lines 65-66, "polyester polyol polyether, polyol" should read -- polyester polyol, polyether polyol --.

Column 11,
Line 4, "(ONA)" should read -- (QNA) --.
Line 5, "(ODA)" should read -- (QDA) --.

Signed and Sealed this

Thirtieth Day of August, 2005

JON W. DUDAS
*Director of the United States Patent and Trademark Office*